(12) United States Patent
Kwak et al.

(10) Patent No.: US 11,322,511 B2
(45) Date of Patent: May 3, 2022

(54) SEMICONDUCTOR MEMORY DEVICE

(71) Applicant: SK hynix Inc., Icheon-si (KR)

(72) Inventors: Sung Kwang Kwak, Icheon-si (KR); Sang Woo Park, Icheon-si (KR); Chang Woon Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 279 days.

(21) Appl. No.: 16/708,849

(22) Filed: Dec. 10, 2019

(65) Prior Publication Data

US 2020/0373321 A1 Nov. 26, 2020

(30) Foreign Application Priority Data

May 20, 2019 (KR) .................. 10-2019-0058969

(51) Int. Cl.
| | |
|---|---|
| *H01L 27/11575* | (2017.01) |
| *H01L 27/11582* | (2017.01) |
| *H01L 23/528* | (2006.01) |
| *H01L 29/417* | (2006.01) |
| *G11C 16/08* | (2006.01) |
| *G11C 16/04* | (2006.01) |

(52) U.S. Cl.
CPC ...... *H01L 27/11575* (2013.01); *H01L 23/528* (2013.01); *H01L 27/11582* (2013.01); *H01L 29/41741* (2013.01); *G11C 16/0483* (2013.01); *G11C 16/08* (2013.01)

(58) Field of Classification Search
CPC ............. H01L 27/11575; H01L 23/528; H01L 27/11582; H01L 29/41741
See application file for complete search history.

(56) References Cited

U.S. PATENT DOCUMENTS

2019/0371800 A1* 12/2019 Nishikawa ........ H01L 27/11582

FOREIGN PATENT DOCUMENTS

| KR | 10-2016-0094117 A | 8/2016 |
|---|---|---|
| KR | 10-2016-0138765 A | 12/2016 |

* cited by examiner

*Primary Examiner* — Robert G Bachner

(57) ABSTRACT

A semiconductor memory device includes a memory cell array disposed on a source plate; a discharge plate disposed on a bottom surface of the source plate; a source line discharge circuit disposed on a substrate below the discharge plate, and electrically coupling the discharge plate to a ground node in response to a source line discharge control signal; and a discharge path provided between the discharge plate and the source line discharge circuit.

20 Claims, 17 Drawing Sheets

FIG.3
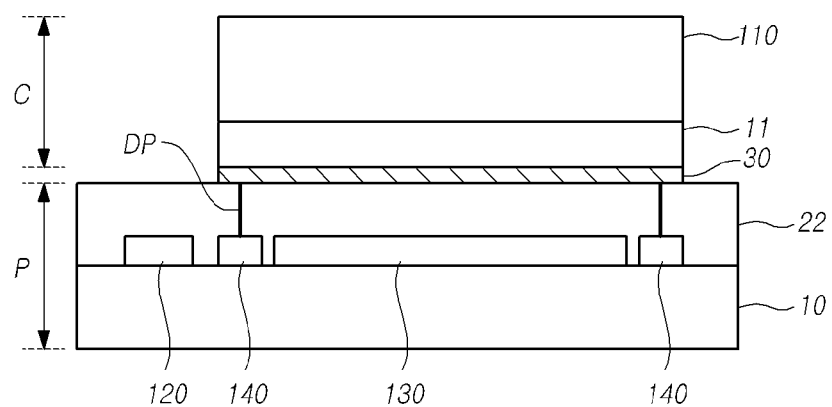
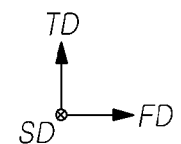

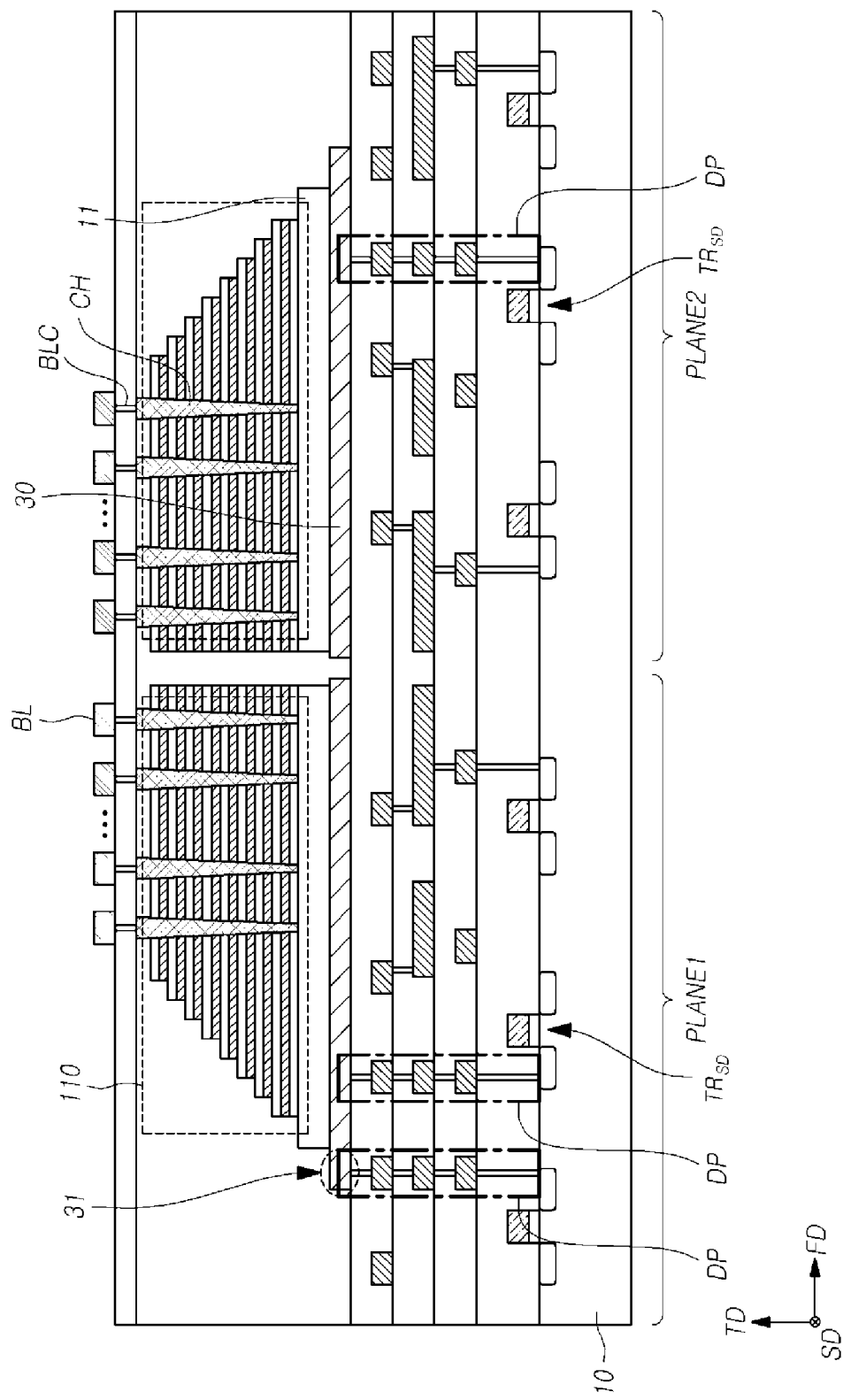

SEMICONDUCTOR MEMORY DEVICE

CROSS-REFERENCE TO RELATED APPLICATION

The present application claims priority under 35 U.S.C. § 119(a) to Korean Patent Application No. 10-2019-0058969 filed in the Korean Intellectual Property Office on May 20, 2019, which is incorporated herein by reference in its entirety.

BACKGROUND

1. Technical Field

Various embodiments generally relate to a semiconductor memory device, and particularly, to a semiconductor memory device including a source plate.

2. Related Art

A semiconductor memory device is a memory device which is realized using a semiconductor material such as silicon (Si), germanium (Ge), gallium arsenide (GaAs) and indium phosphide (InP). Semiconductor memory devices are generally classified into volatile memory devices, which lose data stored therein when power supply is cut off, and nonvolatile memory devices, which maintain data stored therein even after power supply is cut off. Recently, there is an increasing demand for nonvolatile memory devices that may be electrically programmed and erased, and that do not require a refresh function to rewrite data at regular intervals.

In a nonvolatile memory device, a source line bouncing phenomenon occurs when the potential of a source plate undesirably rises during a program operation, a read operation or a verify operation. Since the source line bouncing phenomenon causes an under programming, a read failure or the like, it is necessary to suppress the source line bouncing phenomenon.

SUMMARY

In an embodiment, a semiconductor memory device may include: a memory cell array disposed under a source plate; a discharge plate disposed on a bottom surface of the source plate; a source line discharge circuit disposed on a substrate below the discharge plate, and electrically coupling the discharge plate to a ground node in response to a source line discharge control signal; and a discharge path provided between the discharge plate and the source line discharge circuit.

In an embodiment, a semiconductor memory device may include: a memory cell array including vertical channels which are disposed on a source plate, a plurality of electrode layers and a plurality of interlayer dielectric layers alternately stacked in a vertical direction on the source plate; a discharge plate disposed on a bottom surface of the source plate; a logic structure including a source line discharge circuit disposed on a substrate below the discharge plate, a plurality of dielectric layer disposed between the substrate and the discharge plate; and a discharge path disposed in the plurality of dielectric layers. The discharge path couples the discharge plate and the source line discharge circuit. The plurality of dielectric layers covers the source line discharge circuit.

In an embodiment, a semiconductor memory device may include: a plurality of memory structures each including a source plate and a memory cell array which is disposed on the source plate; a discharge plate disposed on bottom surfaces of the source plates of the memory structures; a logic circuit disposed on a substrate below the discharge plate; and a plurality of discharge paths coupling the logic circuit and the discharge plate.

BRIEF DESCRIPTION OF THE DRAWINGS

FIG. 3 is a cross-sectional view illustrating a schematic layout of a semiconductor memory device in accordance with an embodiment of the disclosure.

FIG. 12 is a cross-sectional view illustrating an example of a semiconductor memory device in accordance with an embodiment of the disclosure.

DETAILED DESCRIPTION

Figure 1:
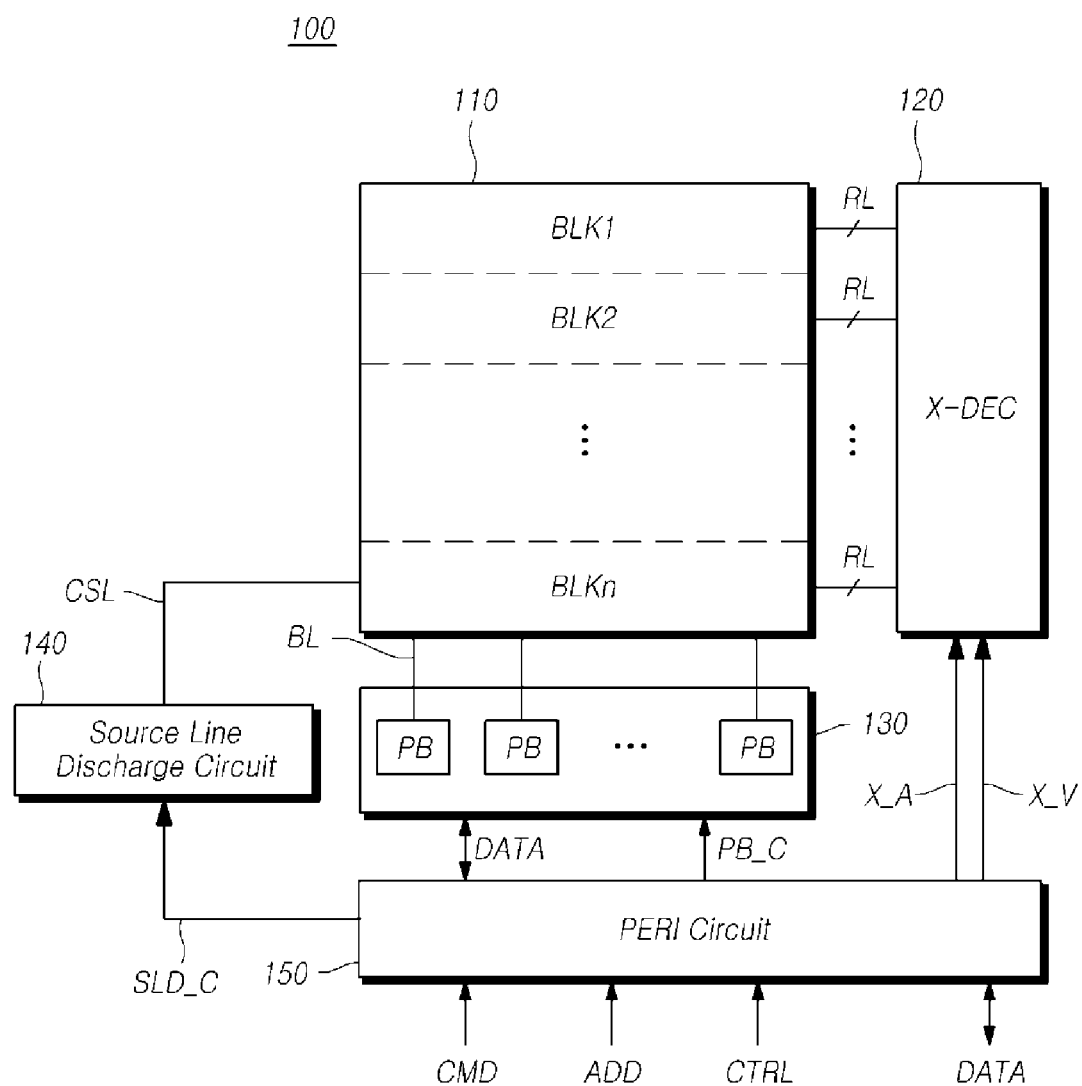
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist of the clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun, (e.g. "a," "an," "the") the article may include a plural of that noun unless specifically stated otherwise.

In Embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other, and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 120, a page buffer circuit 130, a source line discharge circuit 140, and a peripheral circuit (PERI circuit) 150.

The memory cell array 110 may include a plurality of memory blocks BLK1 to BLKn (n is a natural number of 2 or greater). While not illustrated, each of the memory blocks BLK1 to BLKn may include a plurality of cell strings. Each cell string may include at least one drain select transistor, a plurality of memory cells and at least one source select transistor, all which are coupled together in series. Each memory cell may be a volatile memory cell or may be a nonvolatile memory cell. While the descriptions below use a vertical NAND flash device as an example of the semiconductor memory device 100, it is to be understood that the technical spirit of the present disclosure is not limited thereto.

The row decoder 120 may be coupled to the memory cell array 110 through row lines RL. The row lines RL may include at least one drain select line, a plurality of word lines and at least one source select line.

The row decoder 120 may select any one, among the memory blocks BLK1 to BLKn included in the memory cell array 110, in response to a row address X_A provided from the peripheral circuit 150. The row decoder 120 may transfer an operating voltage X_V provided from the peripheral circuit 150, to row lines RL coupled to a memory block selected from among the memory blocks BLK1 to BLKn included in the memory cell array 110.

The page buffer circuit 130 may be coupled to the memory cell array 110 through bit lines BL. The page buffer circuit 130 may include a plurality of page buffers PB which are coupled to the bit lines BL, respectively. The page buffer circuit 130 may receive a page buffer control signal PB_C from the peripheral circuit 150, and may transmit and receive a data signal DATA to and from the peripheral circuit 150. The page buffer circuit 130 may control a bit line, which is arranged in the memory cell array 110, in response to the page buffer control signal PB_C. For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 150 depending on the detected data. The page buffer circuit 130 may apply a signal to a bit line BL based on the data signal DATA received from the peripheral circuit 150 in response to the page buffer control signal PB_C, and thereby, may write data in a memory cell of the memory cell array 110. The page buffer circuit 130 may write or read data in or from a memory cell which is coupled to a word line activated by the row decoder 120.

The source line discharge circuit 140 may be coupled to the memory cell array 110 through a common source line CSL. The source line discharge circuit 140 may receive a source line discharge control signal SLD_C from the peripheral circuit 150. The source line discharge circuit 140 may electrically couple the common source line CSL to a ground terminal in response to the source line discharge control signal SLD_C.

The peripheral circuit 150 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 150 may output signals for writing data in the memory cell array 110 or reading data from the memory cell array 110, for example, the row address X_A, the page buffer control signal PB_C, the source line discharge control signal SLD_C and so forth, based on the command signal CMD, the address signal ADD and the control signal CTRL. The peripheral circuit 150 may generate various voltages including the operating voltage X_V that are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a third direction TD. For example, the first direction FD may correspond to the extending direction of word lines, and the second direction SD may correspond to the extending direction of bit lines. The first direction FD and the second direction SD may substantially perpendicularly intersect with each other. The third direction TD may correspond to a direction that is perpendicular to the first direction FD and the second direction SD. In the following descriptions, the term 'vertical' or 'vertical direction' has substantially the same meaning as the third direction TD. In the drawings, directions indicated by an arrow and a direction opposite thereto represent the same direction.

Figure 2A:
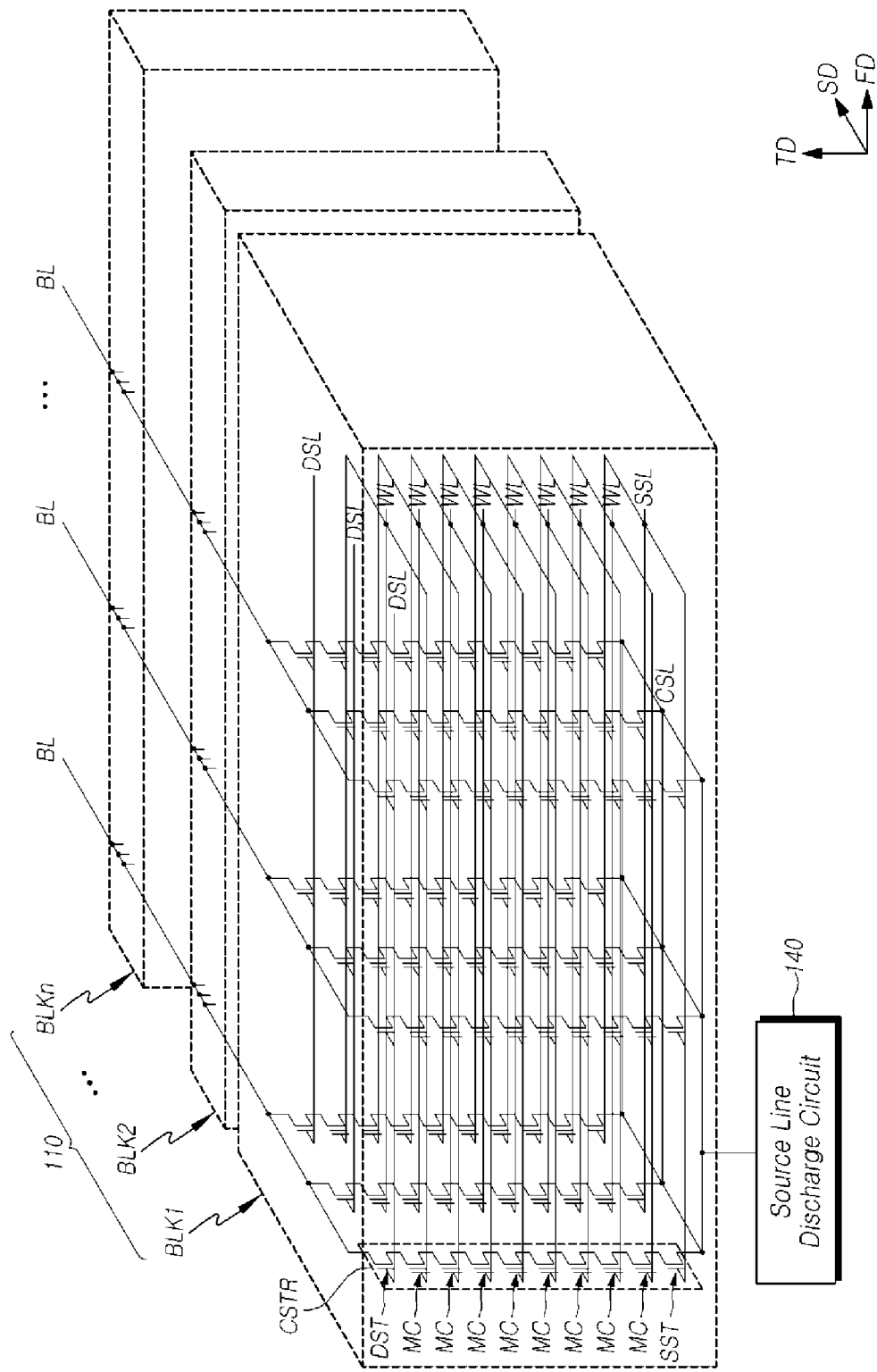
FIG. 2A is an equivalent circuit diagram of a memory cell array illustrated in FIG. 1.
Figure 2B:
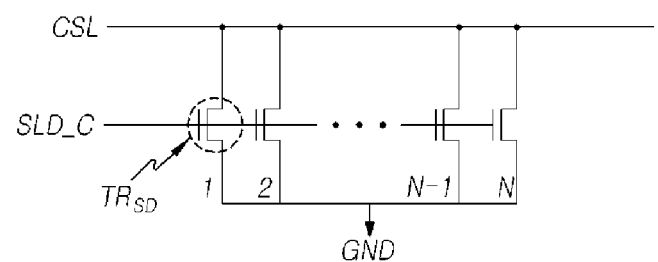
FIG. 2B is an equivalent circuit diagram of a source line discharge circuit illustrated in FIG. 1.

FIG. 2A is an equivalent circuit diagram of a memory cell array illustrated in FIG. 1, and FIG. 2B is an equivalent circuit diagram of the source line discharge circuit illustrated in FIG. 1.

Referring to FIG. 2A, each of the memory blocks BLK1 to BLKn may include a plurality of cell strings CSTR which are coupled between a plurality of bit lines BL and one common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the one common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC, and the source select transistor SST may be coupled in series in the third direction TD.

Drain select lines DSL, a plurality of word lines WL, and a source select line SSL may be disposed between the bit lines BL and the common source line CSL in the third direction TD. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page.

The bit lines BL and the common source line CSL may be coupled in common to the memory blocks BLK1 to BLKn. That is to say, the memory blocks BLK1 to BLKn may share the plurality of bit lines BL and the one common source line CSL. Each of the memory blocks BLK1 to BLKn, however, may have its own drain select lines DSL, a plurality of word lines WL and the source select line SSL. The source line discharge circuit 140 may be coupled to the common source line CSL.

Referring to FIG. 2B, the source line discharge circuit 140 may include a plurality of source line discharge transistors $TR_{SD}$ which are coupled in parallel between the common source line CSL and a ground terminal GND. The source line discharge transistors $TR_{SD}$ may couple the common source line CSL to the ground terminal GND, in response to a source line discharge control signal SLD_C provided from the peripheral circuit 150 (see FIG. 1), in a read operation or a verify operation, and accordingly, may discharge the bit lines BL coupled to the common source line CSL, from a precharge voltage to a ground voltage level.

Since a source plate is coupled to the ground terminal GND in the read operation or the verify operation, the source plate should ideally be at the ground voltage level. However, because the source plate used as the common source line CSL acts as a resistor in and of itself, and because current flowing from the bit lines BL to the source plate in the read operation or the verify operation is large, the potential of the source plate may rise. This is referred to as a source line bouncing phenomenon. As a result, the sensing current of a read target memory cell or a verify target memory cell may decrease because of the self-resistance of the source plate, and due to this fact, the memory cell may be recognized as a programmed cell even though the threshold voltage of the memory cell is lower than a read voltage or a verify voltage. Accordingly, in the case of a read operation, a read failure, in which a memory cell not programmed is read as a programmed cell, may occur, and in a verify operation, an under programming, in which a memory cell not completely programmed is recognized as a completely programmed cell (and thus is not programmed in a next program cycle) may occur.

If discharge paths that couple the source line discharge transistors $TR_{SD}$ and the source plate with each other are distributed by disposing the source line discharge transistors $TR_{SD}$ in a distributed manner and the resistance of the discharge paths is lowered, discharge efficiency may be improved, thereby suppressing the source line bouncing phenomenon. However, it is not easy to dispose the source line discharge transistors $TR_{SD}$ in a distributed manner, while lowering the resistance of the discharge paths, without increasing chip size.

Embodiments of the disclosure may suggest a semiconductor memory device capable of suppressing a source line bouncing phenomenon without increasing a chip size.

Figure 4:
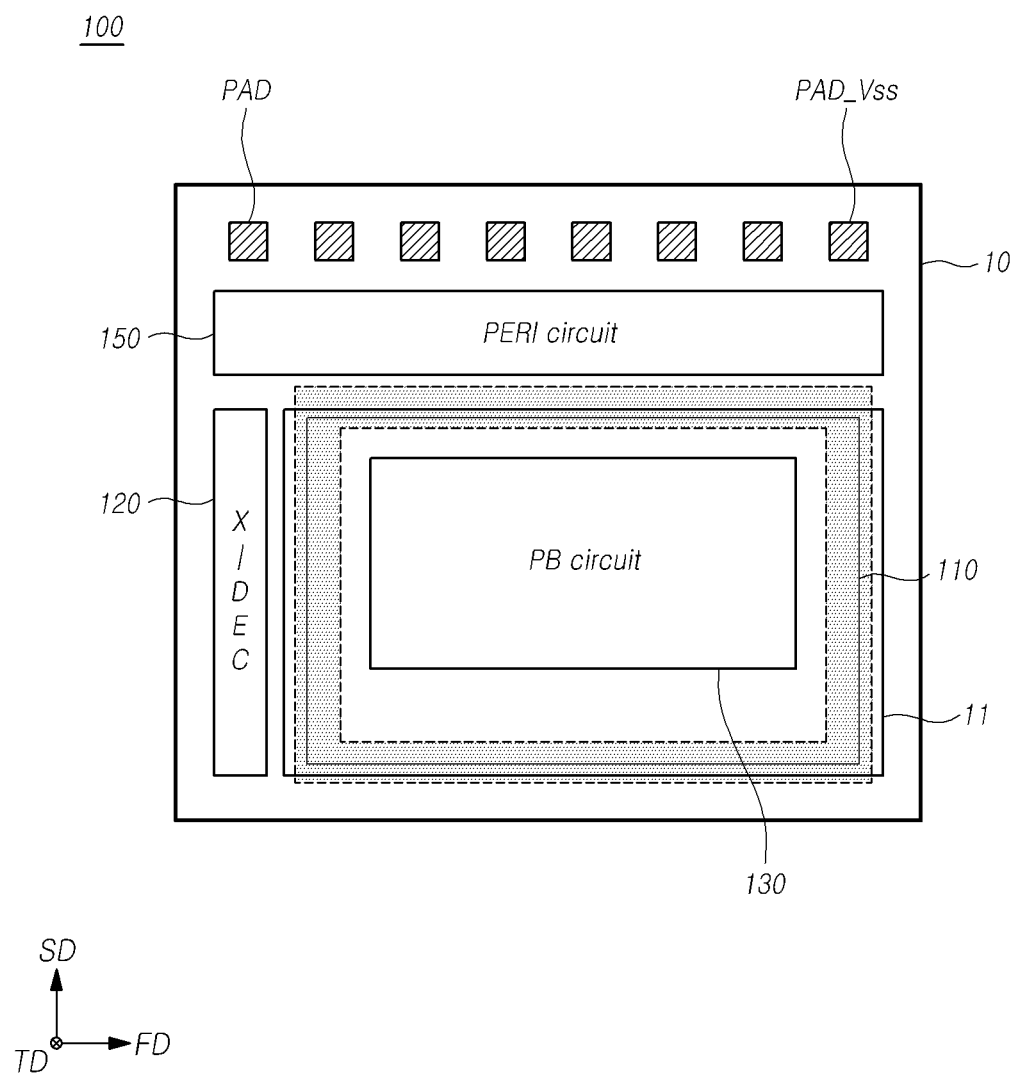
FIG. 4 is a top view illustrating a schematic layout of a semiconductor memory device in accordance with an embodiment of the disclosure.

FIG. 3 is a cross-sectional view illustrating a schematic layout of a semiconductor memory device in accordance with an embodiment of the disclosure, and FIG. 4 is a top view illustrating a schematic layout of a semiconductor memory device in accordance with an embodiment of the disclosure.

Referring to FIGS. 3 and 4, a semiconductor memory device 100 may have a PUC (peri under cell) structure. A logic structure P including a row decoder 120, a page buffer circuit 130, a source line discharge circuit 140 and a peripheral circuit 150 may be disposed under a memory structure C, which includes a memory cell array 110.

The logic structure P may include a substrate 10, and the row decoder 120, the page buffer circuit 130, the source line discharge circuit 140 and the peripheral circuit 150, which are disposed on the substrate 10. The row decoder 120, the page buffer circuit 130, the source line discharge circuit 140 and the peripheral circuit 150 may constitute a logic circuit.

The page buffer circuit 130 may overlap with the memory cell array 110 in the vertical direction, that is, the third direction TD. When viewed from the top, the row decoder 120 may be disposed adjacent to the memory cell array 110 and in the first direction FD. Although the present embodiment illustrates a case where the row decoder 120 does not overlap with the memory cell array 110 in the vertical direction, it is to be noted that the disclosure is not limited thereto. At least a portion of the row decoder 120 may overlap with the memory cell array 110 in the vertical direction.

Referring to FIG. 4, input/output pads PAD, as external contacts of the semiconductor memory device 100 for electrical coupling with an external device (not illustrated) such as a printed circuit board, may be disposed spaced apart in the first direction FD at or near an edge of the semiconductor memory device 100. At least one of the input/output pads PAD may constitute a ground pad PAD_Vss for receiving a ground voltage (Vss) provided from the outside. The peripheral circuit 150 may be disposed adjacent to the input/output pads PAD in the second direction SD.

The source line discharge circuit 140 may be disposed, on substrate 10, in a space remaining after the row decoder 120, the page buffer circuit 130 and the peripheral circuit 150 are disposed on substrate 10. For example, in FIGS. 3 and 4, the source line discharge circuit 140 may be disposed on substrate 10 around the page buffer circuit 130 in a shading area in FIG. 4.

A bottom dielectric layer 22 may be formed on the substrate 10 to cover the row decoder 120, the page buffer circuit 130, the source line discharge circuit 140 and the peripheral circuit 150.

The memory structure C may include a source plate 11 and the memory cell array 110 which is disposed on the source plate 11. The source plate 11 may be formed of polysilicon. A discharge plate 30 may be disposed on the bottom surface of the source plate 11 to provide a discharge surface. Discharge paths DP may be defined in the bottom dielectric layer 22 to electrically couple the discharge plate 30 and the source line discharge circuit 140.

At least a portion of the source line discharge circuit 140 may overlap with the discharge plate 30 in the vertical direction, that is, the third direction TD. In this case, the discharge paths DP may be provided in the third direction TD.

Figure 5:
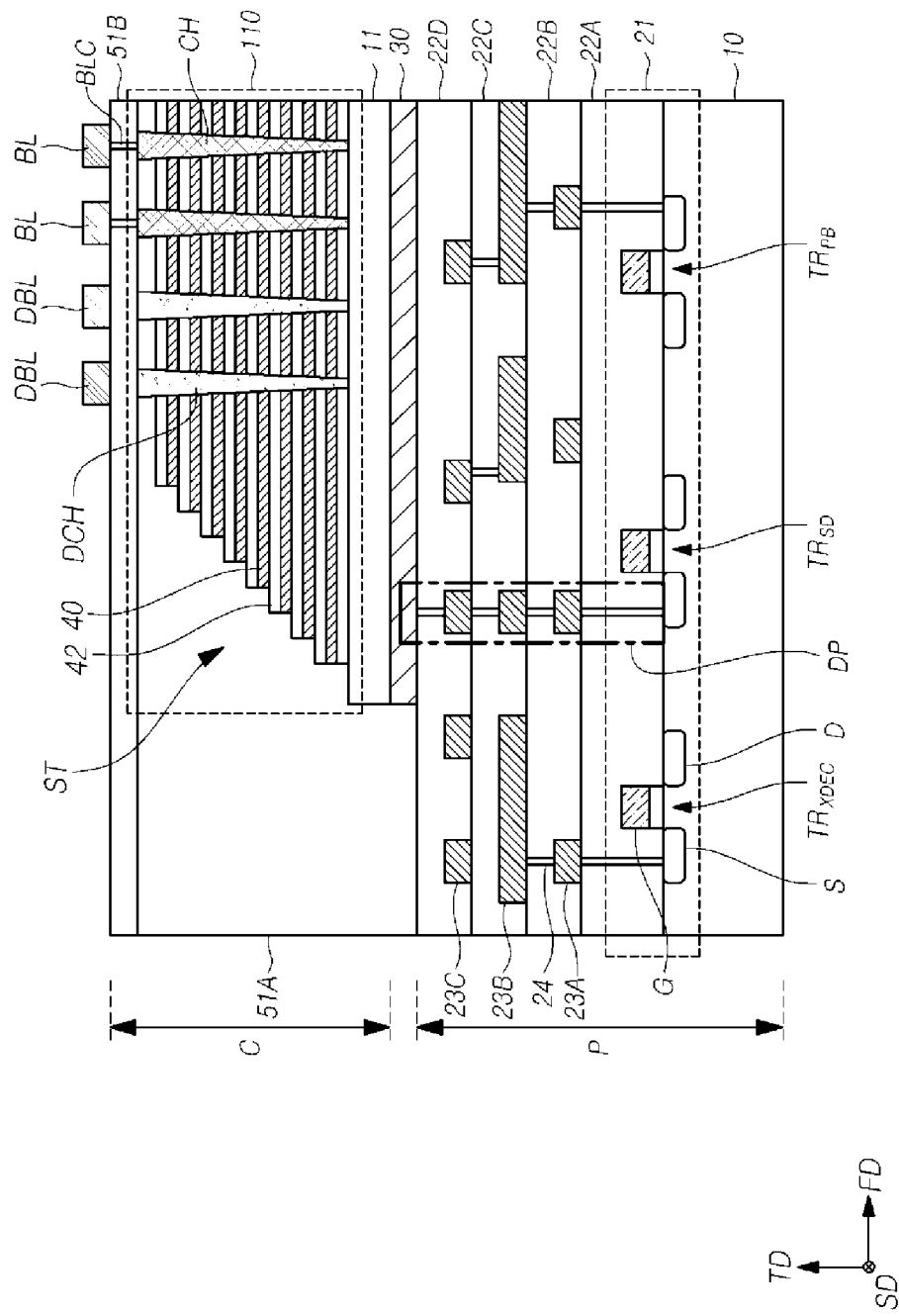
FIGS. 5 to 7 are cross-sectional views illustrating examples of portions of semiconductor memory devices in accordance with embodiments of the disclosure.
Figure 6:
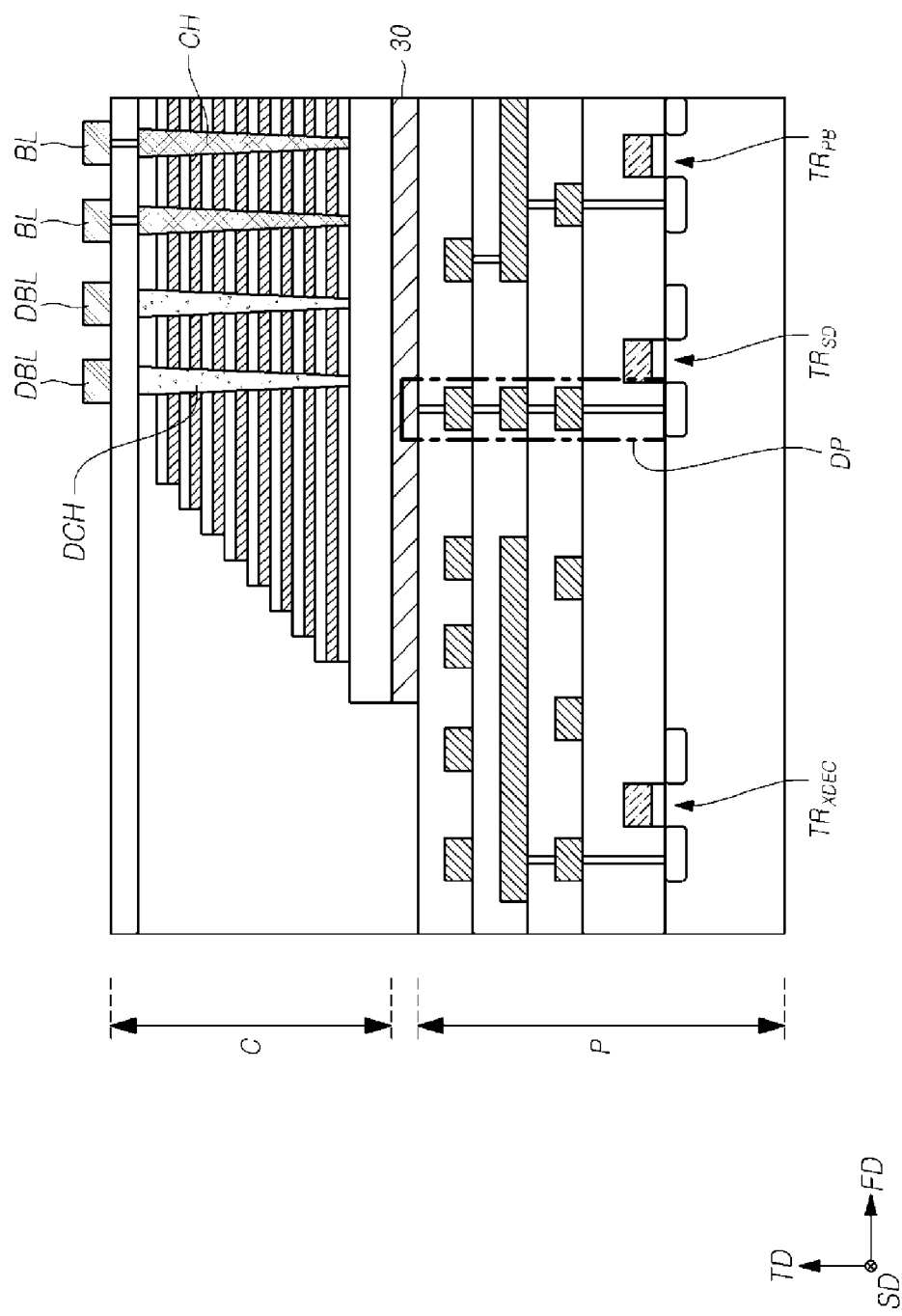
Figure 7:
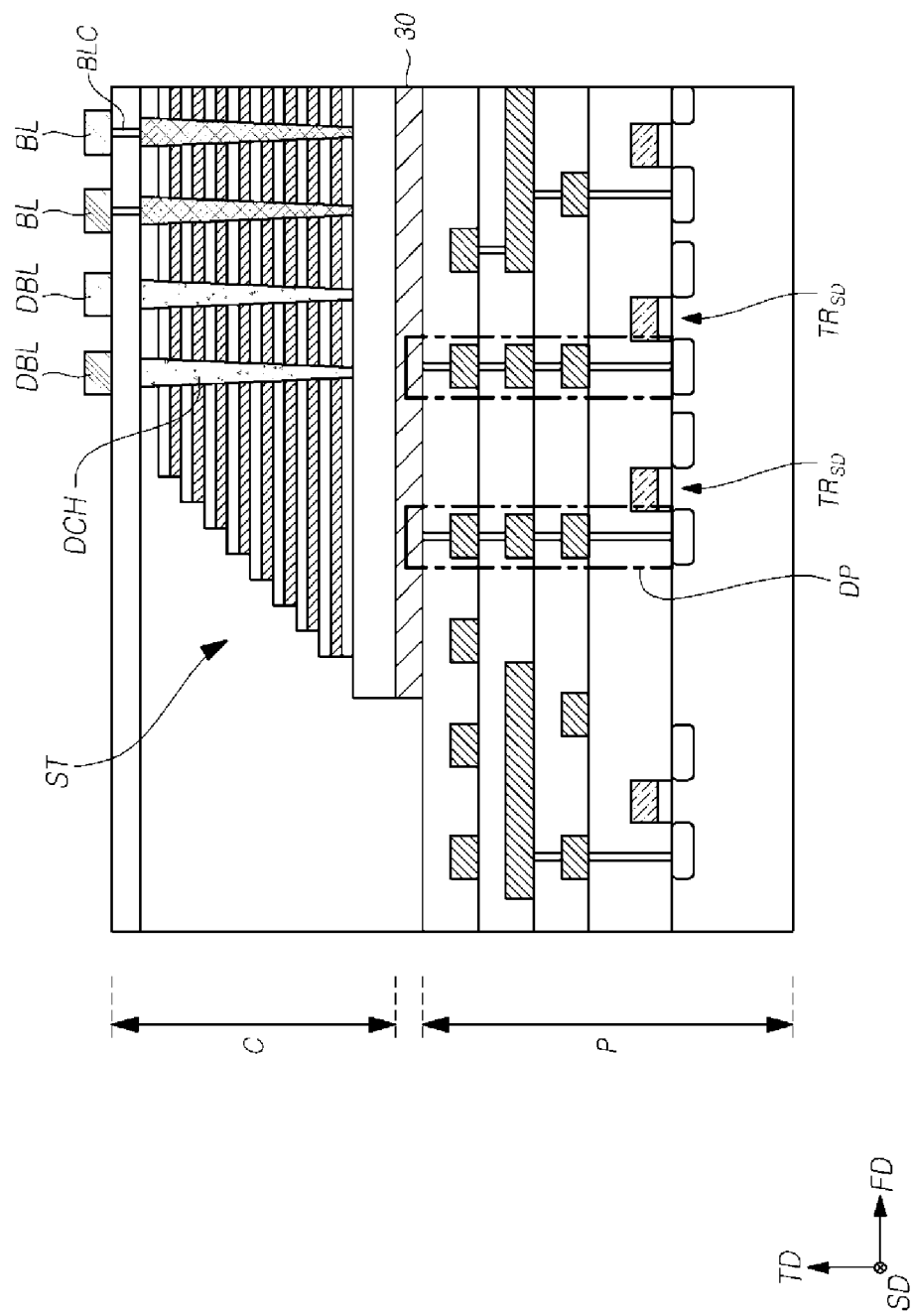

FIGS. 5 to 7 are cross-sectional views illustrating examples of portions of semiconductor memory devices in accordance with embodiments of the disclosure.

Referring to FIG. 5, a memory cell array 110 may include vertical channels CH which are disposed on a source plate 11, and a plurality of electrode layers 40 and a plurality of interlayer dielectric layers 42 which are alternately stacked over the source plate 11 in the third direction TD. Vertical channels CH penetrate through the plurality of electrode layers 40 and the plurality of interlayer dielectric layers 42 in the third direction TD.

The electrode layers 40 may correspond to the row lines RL described above with reference to FIG. 1. Among the electrode layers 40, at least one layer from the lowest may constitute a source select line, and at least one layer from the uppermost may constitute a drain select line. The electrode layers 40 between the source select line and the drain select line may constitute word lines.

The electrode layers 40 may include a conductive material. For example, the electrode layers 40 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 42 may, for example, include silicon oxide.

The vertical channels CH may be coupled to the source plate 11 through the electrode layers 40 and the interlayer dielectric layers 42. While not illustrated in detail, each of the vertical channels CH may include a channel layer and a gate dielectric layer. The channel layer may include polysilicon or monocrystalline silicon, and may include a P-type impurity such as boron (B) that is localized in some areas. As an example, the channel layer may have the shape of a pillar which is completely filled up to its center, or a solid cylinder. In another example, the channel layer may have the shape of a tube in which a center area is open, and a buried dielectric layer may be formed in the open center area of the channel layer. The gate dielectric layer may have the shape of a straw or a cylindrical shell which surrounds the outer wall of the channel layer. While not illustrated, the gate dielectric layer may include a tunnel dielectric layer, a charge storage layer and a blocking layer, which are sequentially stacked in an inward direction from the outer wall of the channel layer. The tunnel dielectric layer may include silicon oxide, hafnium oxide, aluminum oxide, zirconium oxide or tantalum oxide. The charge storage layer may include silicon nitride, boron nitride, silicon boron nitride, or polysilicon doped with an impurity. The blocking layer may include a single layer or a stack layer of silicon oxide, silicon nitride, hafnium oxide, aluminum oxide, zirconium oxide and tantalum oxide. In some embodiments, the gate dielectric layer may have an ONO (oxide-nitride-oxide) stack structure in which an oxide layer, a nitride layer and an oxide layer are sequentially stacked.

Accordingly, the disclosed structures may include memory cells, source select transistors, and drain select transistors formed in areas in which the electrode layers 40 surround the vertical channels CH.

Referring to FIGS. 5-7, by staggering the ends of the layers, each of the electrode layers 40 of the memory cell array 110 may have a pad area which is exposed by another electrode layers 40 positioned thereover. Thus, the memory cell array 110 may have a step structure ST in which the edges of pairs of electrode layers 40 and the interlayer dielectric layers 42 are stepped relative to each other, thereby exposing pad areas of the electrode layers 40. For example, the step structure ST may be disposed at an edge of the memory cell array 110 in the first direction FD. The step structure ST may have a step shape which descends in the first direction FD. While not illustrated, a contact may be disposed on the pad area of each of the electrode layers 40, and through the contact each of the electrode layers 40 may be electrically coupled to a top wiring line which is defined on the memory cell array 110.

The memory cell array 110 may further include dummy vertical channels DCH. The dummy vertical channels DCH may penetrate through the plurality of electrode layers 40 and the plurality of interlayer dielectric layers 42 in the third direction TD, and may be coupled to the source plate 11. The dummy vertical channels DCH may be disposed in an area between the step structure ST and the vertical channels CH.

Dummy source transistors, dummy memory cells and dummy drain transistors may be configured where the electrode layers 40 surround the dummy vertical channels DCH. The dummy source transistors, the dummy memory cells and the dummy drain transistors are dummy elements that do not electrically function and have no influence or role in the operation of the semiconductor memory device 100.

A discharge plate 30 may be disposed on the bottom surface or under of the source plate 11. The discharge plate 30 may be disposed between a fourth bottom dielectric layer 22D of a logic structure P and the source plate 11. The top surface of the discharge plate 30 may be brought into contact with the bottom surface of the source plate 11, and the bottom surface of the discharge plate 30 may be brought into contact with the top surface of the fourth bottom dielectric layer 22D.

In a top view, the discharge plate 30 may have a size or outline as the bottom surface of the source plate 11, and therefore may provide a discharge surface having a size and area corresponding to the bottom surface area of the source plate 11.

A first top dielectric layer 51A may cover the logic structure P and the memory cell array 110. For example, the first top dielectric layer 51A may be defined or disposed on the fourth bottom dielectric layer 22D of the logic structure P to cover any exposed side surfaces and top surfaces of the discharge plate 30 and the source plate 11, exposed portions of electrode layers 40 and interlayer dielectric layers 42, and any exposed side surfaces of the vertical channels CH and the dummy vertical channels DCH near the top of the memory cell array 110. A second top dielectric layer 51B may be defined or disposed on the first top dielectric layer 51A to cover the top surfaces of the vertical channels CH and the dummy vertical channels DCH. The first and second top dielectric layers 51A and 51B may include silicon oxide, for example, HDP (high density plasma) oxide or TEOS (tetra-ethyl-ortho-silicate) oxide.

Bit lines BL and dummy bit lines DBL may be disposed on the second top dielectric layer 51B. In a top view, the bit lines BL may be disposed to overlap with the vertical channels CH, and the dummy bit lines DBL may be disposed to overlap with the dummy vertical channels DCH. Bit line contacts BLC, which pass through the second top dielectric layer 51B, may be defined under the bit lines BL to electrically couple the bit lines BL and the vertical channels CH. No contacts may be defined under the dummy bit lines DBL. The dummy bit lines DBL may not be electrically coupled with the dummy vertical channels DCH.

The logic structure P may include a substrate 10, a logic circuit 21 that is disposed on the substrate 10, bottom dielectric layers 22A to 22D which cover the logic circuit 21, bottom wiring lines 23A to 23C, and bottom contact plugs 24 which are disposed in the bottom dielectric layers 22A to 22D and are electrically coupled to the logic circuit 21.

The substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic circuit 21 may include planar transistors $TR_{XDEC}$, $TR_{PB}$ and $TR_{SD}$. Each of the planar transistors $TR_{XDEC}$, $TR_{PB}$ and $TR_{SD}$ may include a gate G, a source S and a drain D. Elements of the logic circuit 21 may configure or correspond to the row decoder 120, the page buffer circuit 130, the source line discharge circuit 140 and the peripheral circuit 150 of FIG. 1. For example, the reference symbol $TR_{XDEC}$ designates a transistor that constitutes the row decoder 120, and the reference symbol $TR_{PB}$ designates a transistor that constitutes the page buffer circuit 130. Further, the reference symbol $TR_{SD}$ designates a source line discharge transistor that constitutes the source line discharge circuit 140.

The bottom dielectric layers 22A to 22D may include first to fourth bottom dielectric layers 22A to 22D which are sequentially disposed on the substrate 10. The first to fourth bottom dielectric layers 22A to 22D may include silicon oxide, for example, HDP oxide or TEOS oxide.

The bottom wiring lines 23A to 23C may include first bottom wiring lines 23A that are disposed on the first bottom dielectric layer 22A, second bottom wiring lines 23B that are disposed on the second bottom dielectric layer 22B, and third bottom wiring lines 23C that are disposed on the third bottom dielectric layer 22C. The bottom contact plugs 24 may pass through the first to fourth bottom dielectric layers 22A to 22D, and thereby, may electrically couple the logic circuit 21 and the first bottom wiring lines 23A, and electrically couple the bottom wiring lines 23A to 23C, which are disposed at or on different layers, and electrically couple the third bottom wiring lines 23C to the discharge plate 30. The bottom wiring lines 23A to 23C and the bottom contact plugs 24 may constitute a discharge path DP that couples the source line discharge transistor $TR_{SD}$ and the discharge plate 30.

The bottom wiring lines 23A to 23C may be formed of a material which has properties that may not exhibit or resist a process failure (for example, a hillock) at a maximum temperature (hereinafter, referred to as a 'process critical temperature') in a process for forming a memory structure C or the bit lines BL. In other words, the bottom wiring lines 23A to 23C may be formed of a conductive material which has a heat-resistant characteristic at the process critical temperature. For example, the bottom wiring lines 23A to 23C may include a material which has a melting point higher than the process critical temperature, such as tungsten (W). Because the bottom wiring lines 23A to 23C are formed before forming the memory structure C, a material having a high melting point and a high resistivity may be used as a conductive material which forms the bottom wiring lines 23A to 23C. The bottom contact plugs 24 may also be formed of the same material as the bottom wiring lines 23A to 23C.

On the other hand, a conductive material which forms the bit lines BL may include a material which has a resistivity lower than that of the conductive material which forms the bottom wiring lines 23A to 23C. For example, a material which forms the bit lines BL may include a material such as copper or aluminum that has a low resistivity, although it may cause or contribute to a process failure at a temperature lower than the process critical temperature.

Due to the above-described limitations in manufacturing processes, the resistivity of the bottom wiring lines 23A to 23C may have a value relatively larger than that of the bit lines BL. In order to increase discharge efficiency, since the resistance of the discharge path DP should be small, the length of the bottom wiring lines 23A to 23C on the discharge path DP should be as short as possible.

The discharge plate 30 may be formed of a material which has a resistivity smaller than that of a material used as the source plate 11. The discharge plate 30 may be formed of a metal.

The discharge plate 30 may be formed of a conductive material which has a heat-resistant characteristic at the process critical temperature. For example, the discharge plate 30 may include a material which has a melting point higher than the process critical temperature, for example, tungsten (W). Because, like the bottom wiring lines 23A to 23C, the discharge plate 30 is formed before forming the memory structure C and the bit lines BL, a material having a high melting point and a high resistivity may be used as a conductive material which forms the discharge plate 30.

The discharge plate 30 may be formed of the same material as the bottom wiring lines 23A to 23C. The plate-shaped discharge plate 30 has a far greater width and area in the first and second directions than each of the line-shaped bottom wiring lines 23A to 23C. Therefore, even if the discharge plate 30 is formed of the same material as the bottom wiring lines 23A to 23C, the resistance of the discharge plate 30 may be lower than the resistance of the bottom wiring lines 23A to 23C.

Since a discharge surface having a large area is provided under the source plate 11 by the discharge plate 30, the length of the bottom wiring lines 23A to 23C on the discharge path DP may be determined to be short, regardless of the position of the source line discharge transistor $TR_{SD}$, and the resistance of the discharge path DP may be reduced. Since it is not necessary to limit the position of the source line discharge transistor $TR_{SD}$ to reduce the resistance of the discharge path DP, the source line discharge circuit may be disposed in an extra space (See the shading area in FIG. 4) left after placing the row decoder 120 (see FIG. 4), the page buffer circuit 130 (see FIG. 4) and the peripheral circuit 150 (see FIG. 4).

For example, the transistor $TR_{XDEC}$ constituting the row decoder 120 (see FIG. 1) may be adjacent to the memory cell array 110 in the first direction FD when viewed from the top, and the transistor $TR_{PB}$ constituting the page buffer circuit 130 (see FIG. 1) may overlap with the bit lines BL in the third direction TD. The source line discharge transistor $TR_{SD}$ constituting the source line discharge circuit 140 (see FIG. 1) may be disposed under the stepped structure ST, and accordingly, may overlap with the step structure ST of the memory cell array 110 in the third direction TD. In other words, at least a portion of the source line discharge circuit 140 (see FIG. 1) may overlap with the step structure ST of the memory cell array 110 in the third direction TD.

The bottom contact plugs 24 constituting the discharge path DP may be aligned on the source line discharge transistor $TR_{SD}$ in the vertical direction, that is, the third direction TD. The discharge path DP may be configured in the form of a vertical line which couples the source line discharge transistor $TR_{SD}$ and the discharge plate 30. In this way, when the discharge path DP is configured in the form of a vertical line, since the length of the bottom wiring lines 23A to 23C on the discharge path DP may be minimized, the resistance of the discharge path DP may be minimized.

While the embodiment described above with reference to FIG. 5 illustrates a case where the source line discharge transistor $TR_{SD}$ is disposed under the step structure ST, it is to be noted that the position of the source line discharge transistor $TR_{SD}$ is not limited thereto. For example, as illustrated in FIG. 6, the source line discharge transistor $TR_{SD}$ may be disposed under the dummy bit lines DBL. Namely, at least a portion of the source line discharge circuit 140 (see FIG. 1) may be disposed under the dummy bit lines DBL.

On the other hand, as illustrated in FIG. 7, a plurality of source line discharge transistors $TR_{SD}$ may be disposed under the step structure ST and the dummy bit lines DBL. Namely, at least a portion of the source line discharge circuit 140 (see FIG. 1) may be disposed under the step structure ST and the dummy bit lines DBL.

Figure 8:
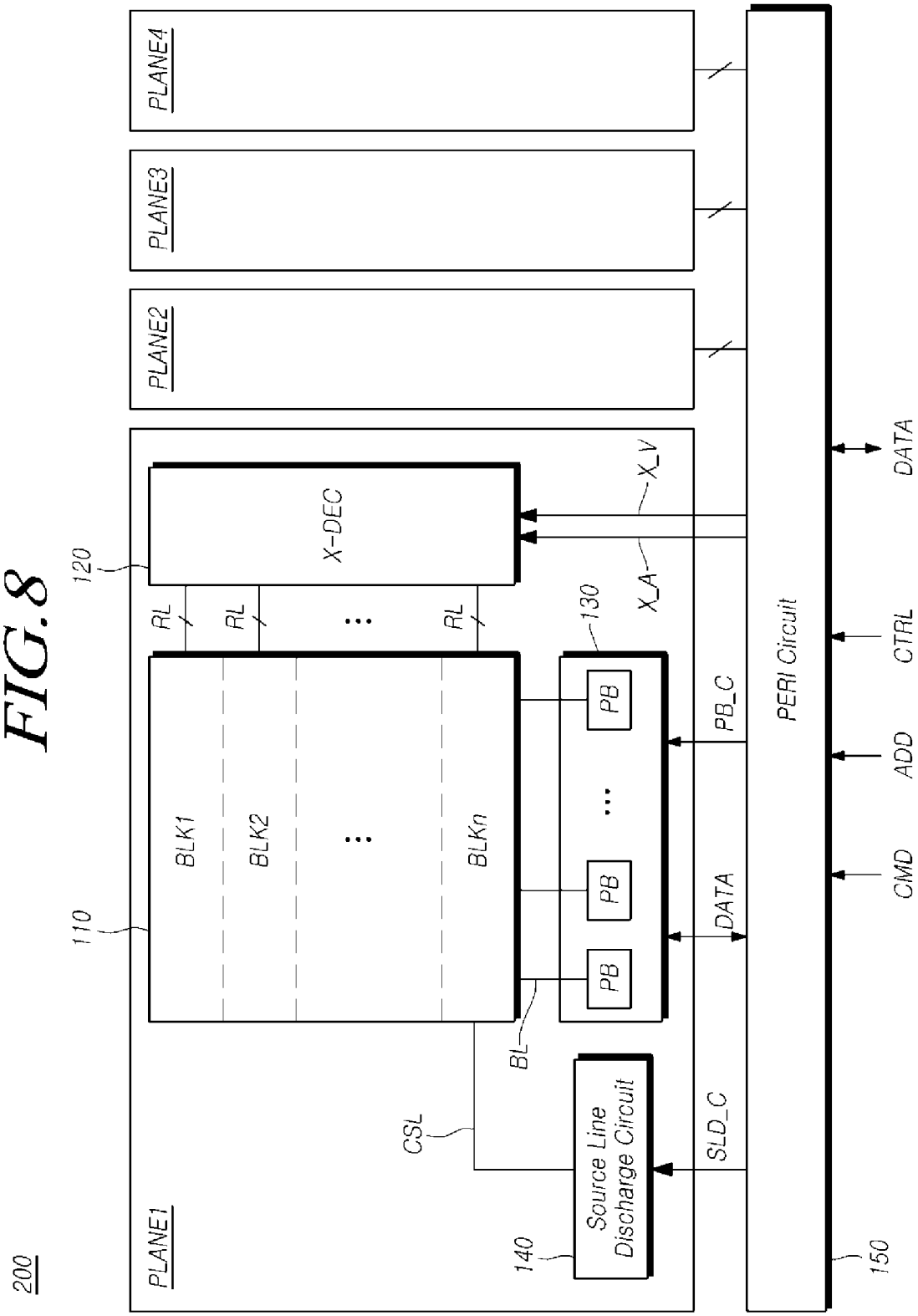
FIG. 8 is a block diagram illustrating an example of a semiconductor memory device in accordance with an embodiment of the disclosure.
Figure 9:
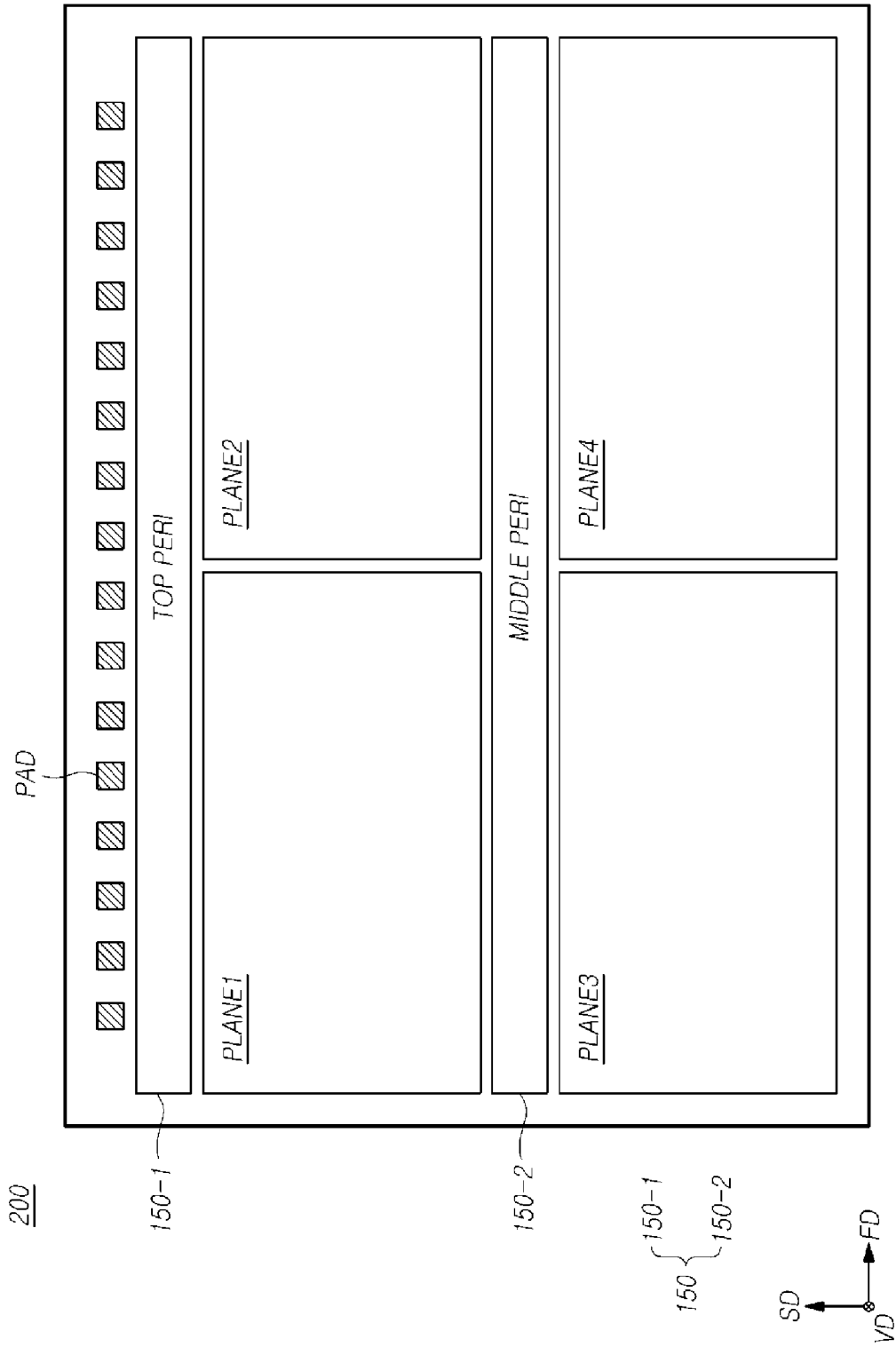
FIG. 9 is a top view illustrating an example of a schematic layout of the semiconductor memory device illustrated in FIG. 8.
Figure 10:
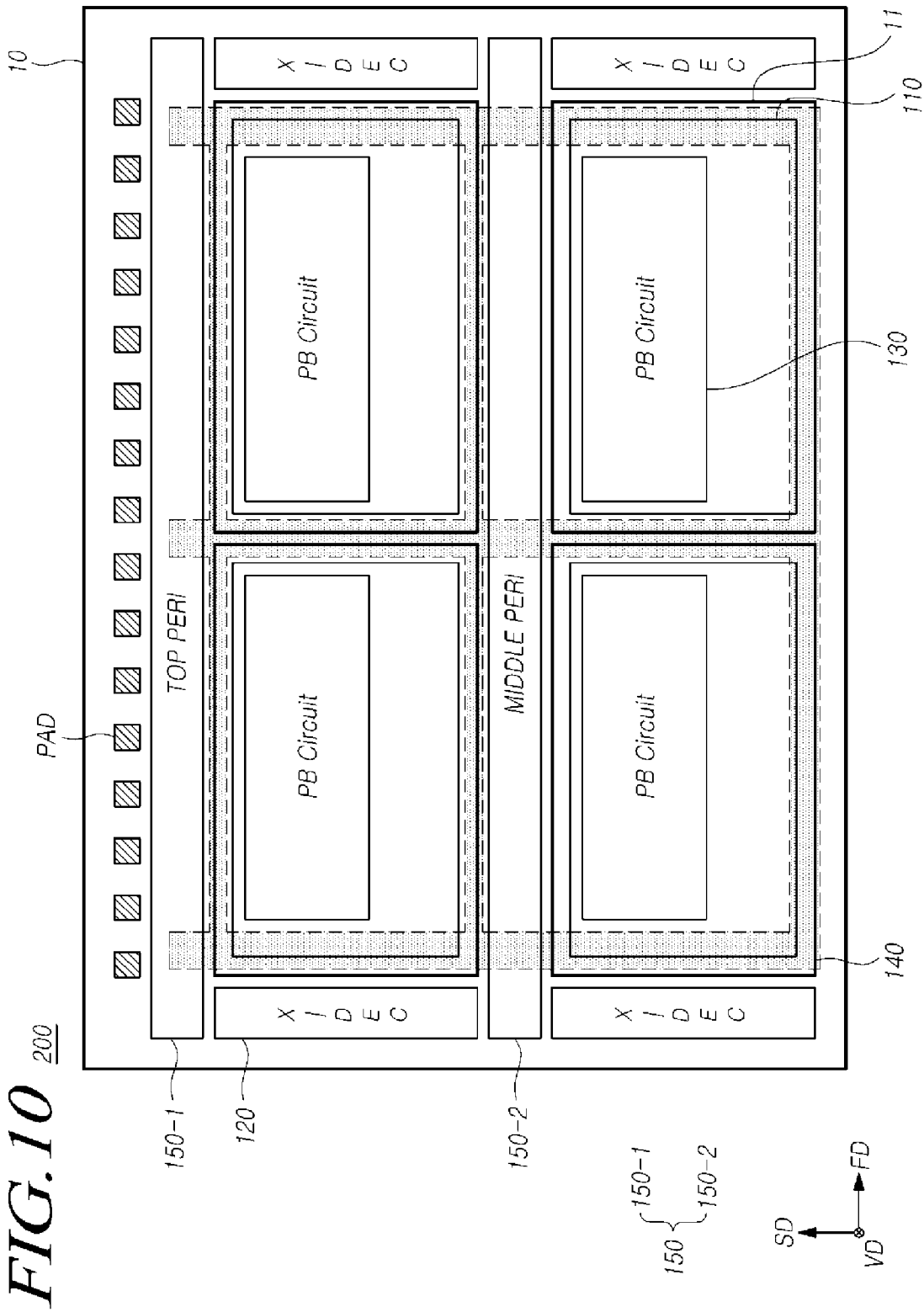
FIG. 10 is a detailed top view of FIG. 9 with an embodiment of the disclosure.
Figure 11:
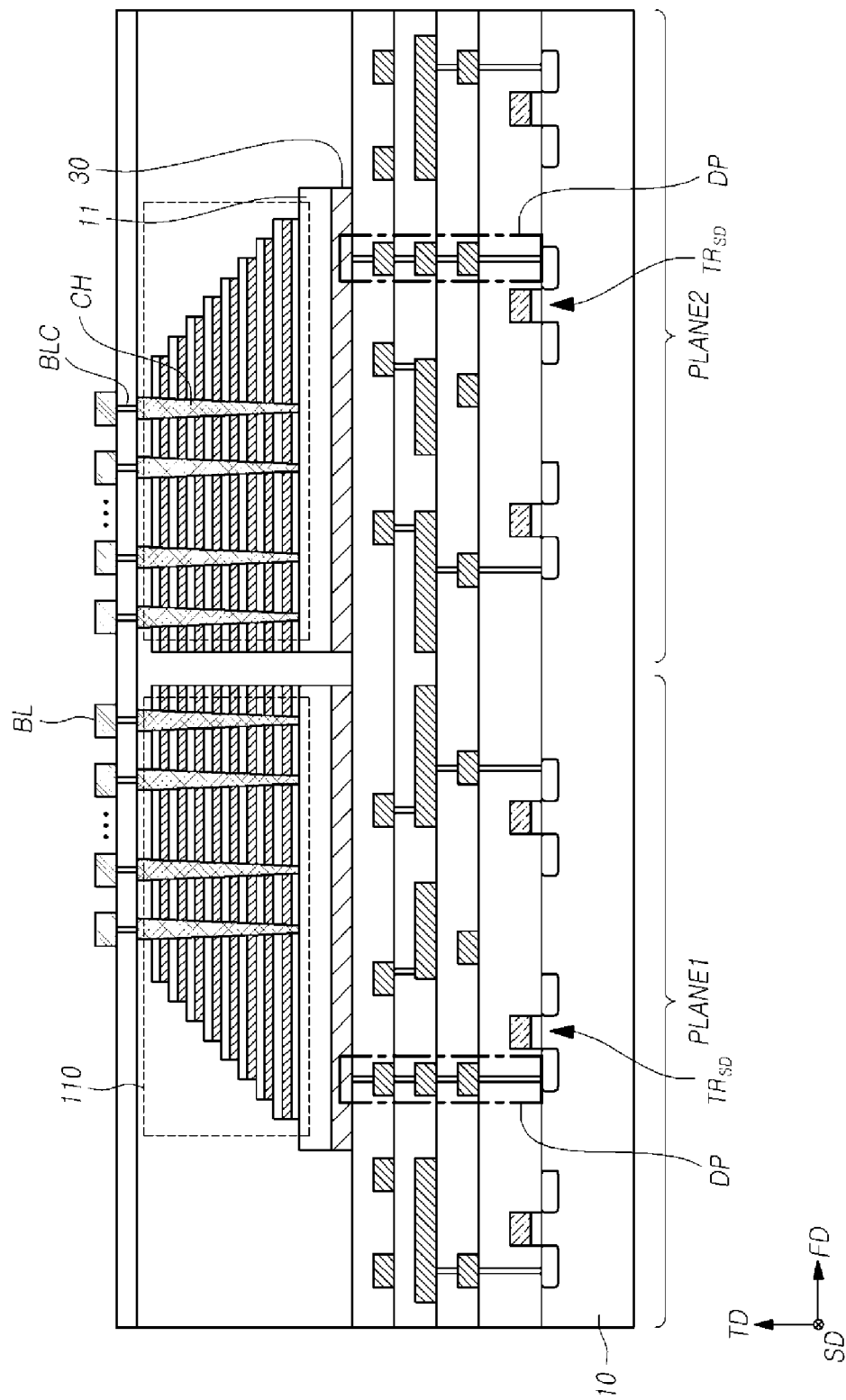
FIG. 11 is a cross-sectional view schematically illustrating an example of a semiconductor memory device illustrated in FIG. 10 in accordance with an embodiment of the disclosure.

FIG. 8 is a block diagram illustrating an example of a semiconductor memory device in accordance with an embodiment of the disclosure, FIG. 9 is a top view illustrating an example of a schematic layout of the semiconductor memory device illustrated in FIG. 8, FIG. 10 is a detailed top view of FIG. 9, and FIG. 11 is a cross-sectional view schematically illustrating an example of a semiconductor memory device illustrated in FIG. 10.

Referring to FIG. 8, a semiconductor memory device 200 may include a plurality of planes PLANE1 to PLANE4. The semiconductor memory device 200 may have a multi-plane structure. FIG. 8 illustrates a four-plane structure, however, embodiments of the disclosure are not limited thereto.

Each of the planes PLANE1 to PLANE4 may include a memory cell array 110, a row decoder 120, a page buffer circuit 130 and a source line discharge circuit 140. The planes PLANE1 to PLANE4 may share one peripheral circuit 150.

The peripheral circuit 150 may provide a source line discharge control signal SLD_C individually to each of the planes PLANE1 to PLANE4, and may individually control each source line discharge circuits 140 in the different planes. The operations of the source line discharge circuits 140 included in the planes PLANE1 to PLANE4 may be controlled independently of one another in response to the source line discharge control signal SLD_C provided from the peripheral circuit 150, and may perform source line discharge operations independently of one another.

Referring to FIG. 9, when viewed from the top, the planes PLANE1 to PLANE4 may be disposed on a substrate 10 in the form of a 2×2 matrix in the first direction FD and the second direction SD.

Input/output pads PAD may be disposed at a periphery of the substrate 10 in the first direction FD. The peripheral circuit 150 may be disposed by being distributed at the periphery of the substrate 10 where the input/output pads PAD are positioned, and a center portion of the substrate 10. Hereinafter, for the sake of convenience in explanation, a peripheral circuit 150-1 which is disposed at the periphery of the substrate 10 will be defined as a first peripheral circuit, and a peripheral circuit 150-2 which is disposed at the center portion of the substrate 10 will be defined as a second peripheral circuit.

The first peripheral circuit 150-1 may be disposed between the input/output pads PAD and first and second planes PLANE1 and PLANE2, and the second peripheral circuit 150-2 may be disposed between the first and second planes PLANE1 and PLANE2 and third and fourth planes PLANE3 and PLANE4.

Referring to FIGS. 9 to 11, a source plate 11 may be provided individually to each of the planes PLANE1 to PLANE4. A discharge plate 30 may be divided into a plurality of segments, and the plurality of segments of the discharge plate 30 may be provided individually to source plates 11, respectively. Each of the segments of the discharge plate 30 may be disposed on the bottom surface of or under a corresponding source plate 11. When viewed from the top, each of the segments of the discharge plate 30 may have substantially the same size and area as the bottom surface of the corresponding source plate 11.

The segments of the discharge plate 30 may be coupled to different source line discharge transistors $TR_{SD}$ through different discharge paths DP, respectively.

FIG. 12 is a cross-sectional view schematically illustrating a representation of an example of a semiconductor memory device in accordance with an embodiment of the disclosure.

When viewed from the top, a discharge plate 30 may have a size larger than that of the bottom surface of a source plate 11. Referring to FIG. 12, the discharge plate 30 may have a flange portion 31 which projects out in the first direction beyond the side or edge of the source plate 11. While a discharge path DP couples a source line discharge transistor $TR_{SD}$ disposed under the source plate 11 with the discharge plate 30, another discharge path DP couples a source line discharge transistor $TR_{SD}$ disposed under the flange portion 31 of the discharge plate 30 with the discharge plate 30.

According to the present embodiment, a larger number of source line discharge transistors $TR_{SD}$ may be coupled to the discharge plate 30 through vertical discharge paths DP, and accordingly, it is possible to provide more improved discharge efficiency.

Figure 13A:
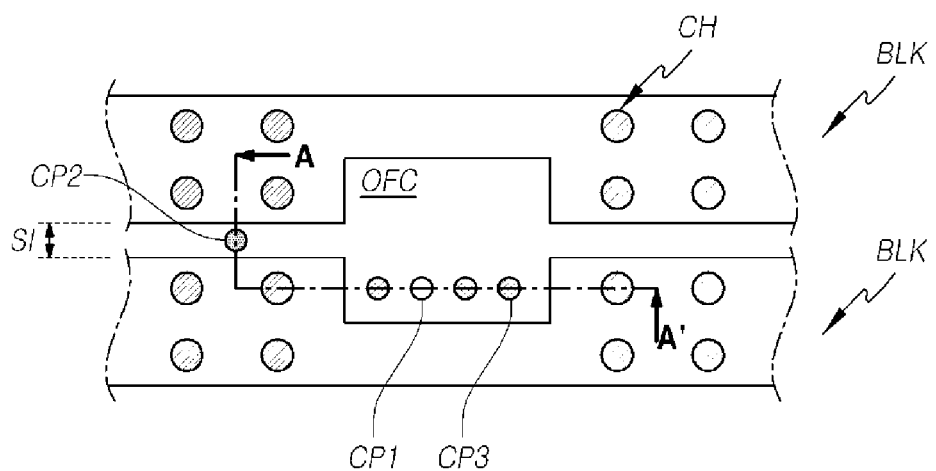
FIGS. 13A and 13B are views illustrating an example of a semiconductor memory device in accordance with an embodiment of the disclosure.
Figure 13B:
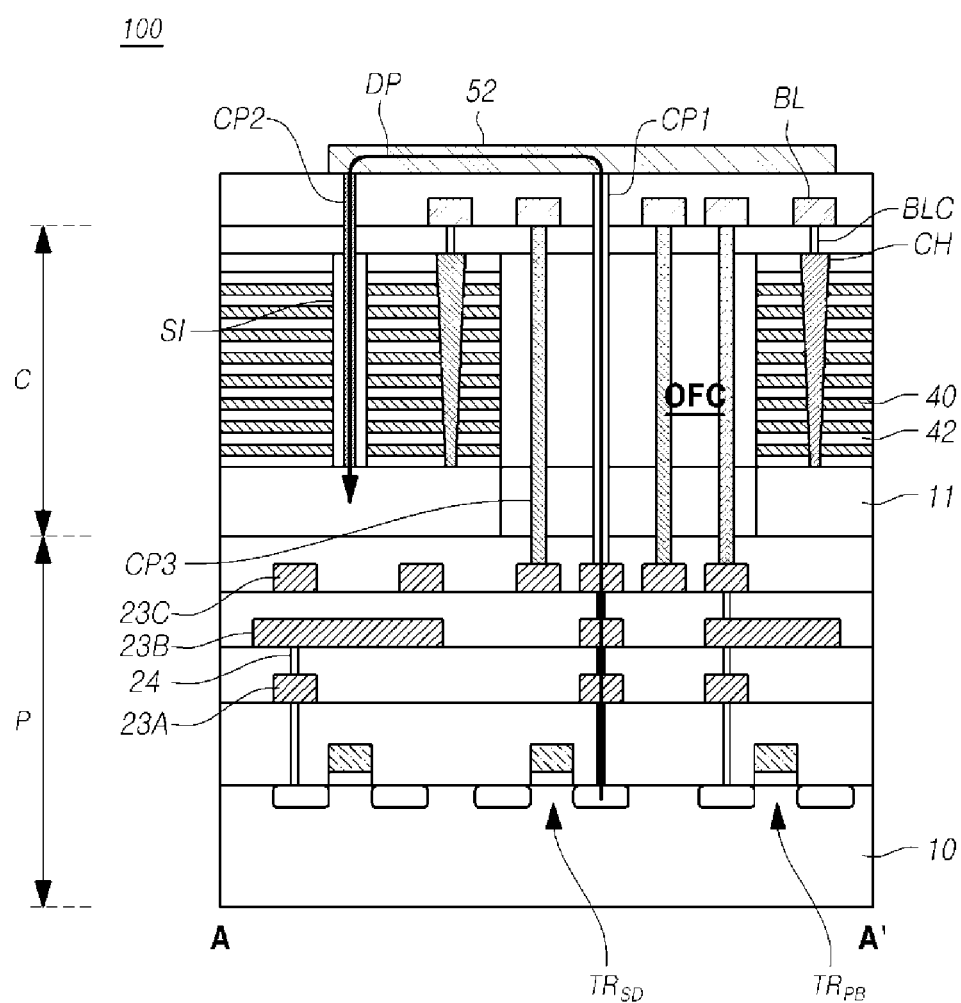

FIGS. 13A and 13B are views illustrating an example of a semiconductor memory device.

Specifically, FIG. 13A is a top view illustrating a portion of the semiconductor memory device of the disclosure, and FIG. 13B is a cross-sectional view taken along the line A-A' of FIG. 13A.

Referring to FIGS. 13A and 13B, in order to reduce the resistance of a discharge path DP, the length of bottom wiring lines 23A to 23C included in the discharge path DP may be reduced, and a top wiring line 52 may be used in configuring the discharge path DP. In this case, a first contact plug CP1 that couples a bottom wiring line 23C, which is coupled to a source line discharge transistor $TR_{SD}$, with the top wiring line 52, and a second contact plug CP2 that couples the top wiring line 52 with a source plate 11 may be included in semiconductor memory device 100.

However, because electrode layers 40 of a memory cell array 110 exist between the bottom wiring line 23C and the top wiring line 52, and between the top wiring line 52 and the source plate 11, areas in which the contact plugs CP1 and CP2 may be disposed are limited. For example, the first contact plug CP1 may be disposed in an opening OFC that is defined to provide a passage through which third contact plugs CP3, which couple transistors $TR_{PB}$ constituting a page buffer circuit with bit lines BL, pass. As another example, the second contact plug CP2 may be disposed in a slit SI that separates memory blocks BLK from each other.

In order to minimize the length of the bottom wiring lines 23A to 23C constituting the discharge path DP, the source line discharge transistor $TR_{SD}$ needs to be disposed under the opening OFC in which the first contact plug CP1 is positioned. However, since a plurality of transistors $TR_{PB}$ which are coupled to the bit lines BL through the third contact plugs CP3 are disposed under the opening OFC, it is not easy to position source line discharge transistors $TR_{SD}$ to avoid the transistors $TR_{PB}$. Therefore, since an area in which the source line discharge transistors $TR_{SD}$ may be disposed is so small or limited so that it is difficult to include a sufficient number of source line discharge transistors $TR_{SD}$, the discharge efficiency of the source plate 11 may deteriorate.

If the area of the opening OFC is increased, the number of source line discharge transistors $TR_{SD}$ may be increased, whereby discharge efficiency may be improved to some extent. However, if the area of the opening OFC is increased, then a chip size may increase. Meanwhile, in order to dispose the second contact plug CP2, the width of the slit SI needs to be equal to or larger than a predetermined size. However, if the width of the slit SI is increased, a chip size may increase as well.

According to embodiments of the disclosure, the discharge plate 30 is disposed on the bottom surface of the source plate 11, and thereby, a discharge surface having low resistance is formed under the source plate 11. As a consequence, it is possible to provide a discharge path having low resistance which couples a source line discharge transistor and the source plate 11, even without using the top wiring line 52 on the memory cell array 110. Therefore, since the contact plugs CP1 and CP2, which are needed in the case where the top wiring line 52 is used in configuring a discharge path, are not needed, a space used for the disposition of the contact plugs CP1 and CP2 may be removed, and thereby, the size of a semiconductor memory device may be reduced.

Since the positional limitation of the source line discharge transistor $TR_{SD}$ is mitigated and thus it is possible to dispose the source line discharge transistor $TR_{SD}$ in an extra space, an increase in layout area due to the presence of the source line discharge transistor $TR_{SD}$ may be minimized, and thereby, the size of the semiconductor memory device may be reduced.

In addition, since the positional limitation of the source line discharge transistor $TR_{SD}$ is mitigated and thus it is possible to increase the number of source line discharge transistors $TR_{SD}$, the discharge efficiency of the source plate 11 may be improved and thereby the source line bouncing phenomenon may be suppressed.

Moreover, since the discharge surface having a large area is provided under the source plate 30, the entire area of the source plate 30 may be effectively discharged. As a consequence, failures such as an under programming and a read failure may be prevented for all memory cells included in a memory device, regardless of the positions of the memory cells.

Figure 14:
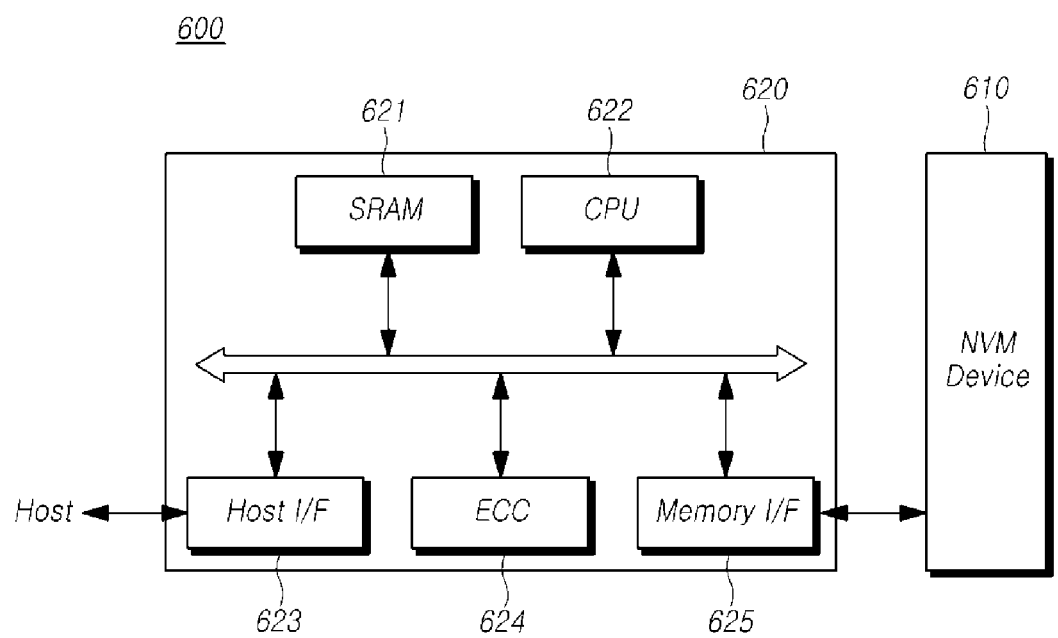
FIG. 14 is a diagram schematically illustrating an example of a memory system including a semiconductor memory device in accordance with an embodiment of the disclosure.

FIG. 14 is a block diagram schematically illustrating an example of a memory system including a semiconductor memory device in accordance with an embodiment of the disclosure.

Referring to FIG. 14, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 15:
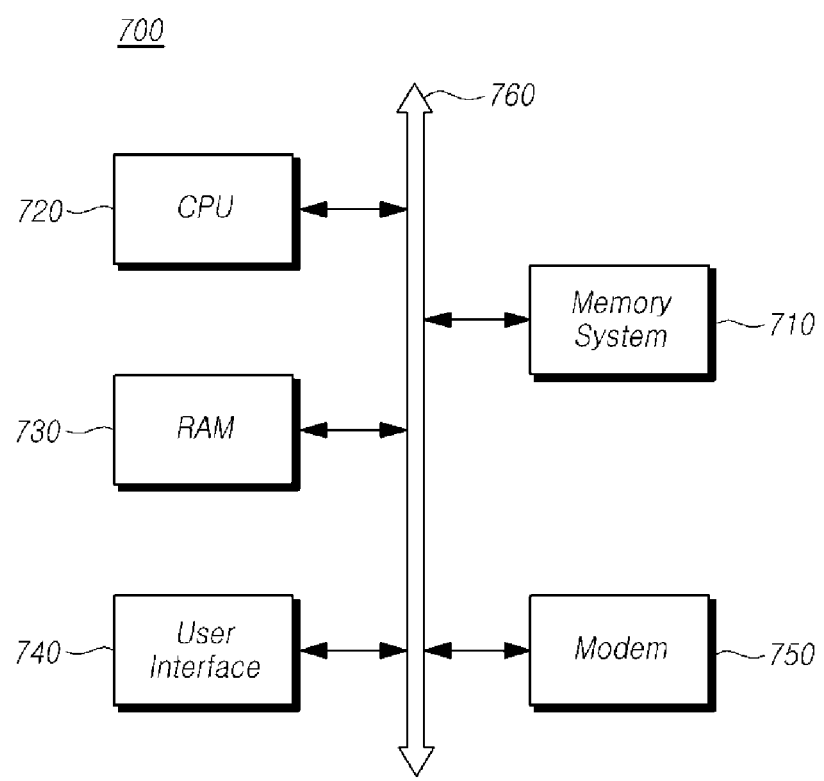
FIG. 15 is a block diagram schematically illustrating a computing system including a semiconductor memory device in accordance with an embodiment of the disclosure.

FIG. 15 is a block diagram schematically illustrating a representation of an example of a computing system including a semiconductor memory device in accordance with an embodiment of the disclosure.

Referring to FIG. 15, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
   a memory cell array disposed on a source plate;
   a discharge plate disposed under a bottom surface of the source plate;
   a source line discharge circuit disposed on a substrate below the discharge plate, and electrically coupling the discharge plate to a ground node in response to a source line discharge control signal from a peripheral circuit on the substrate during a memory operation; and
   a discharge path provided between the discharge plate and the source line discharge circuit.

2. The semiconductor memory device according to claim 1, wherein the discharge plate is formed of a material which has a resistivity smaller than a resistivity of a material in the source plate.

3. The semiconductor memory device according to claim 1, wherein the source plate includes polysilicon, and the discharge plate includes a metal.

4. The semiconductor memory device according to claim 1, wherein the discharge plate has an area substantially similar to a surface area of the bottom surface of the source plate.

5. The semiconductor memory device according to claim 1, wherein the discharge plate extends beyond the bottom surface of the source plate with a flange portion.

6. The semiconductor memory device according to claim 1, wherein the source line discharge circuit overlaps with the discharge plate in a vertical direction.

7. The semiconductor memory device according to claim 6, wherein the discharge path is provided in the vertical direction.

8. A semiconductor memory device comprising:
   a memory cell array including vertical channels which are disposed on a source plate;
   a plurality of electrode layers and a plurality of interlayer dielectric layers alternately stacked in a vertical direction on the source plate;
   a discharge plate disposed on a bottom surface of the source plate;
   a logic structure including a source line discharge circuit disposed on a substrate below the discharge plate;
   a plurality of dielectric layers disposed between the substrate and the discharge plate; and
   a discharge path disposed in the plurality of dielectric layers,
   wherein the discharge path couples the discharge plate and the source line discharge circuit,
   wherein the plurality of dielectric layers covers the source line discharge circuit, and
   wherein the source line discharge circuit electrically couples the discharge plate to a ground node in response to a source line discharge control signal from a peripheral circuit of the logic structure during a memory operation.

9. The semiconductor memory device according to claim 8, wherein the memory cell array includes a step structure which exposes pad area of each of the plurality of electrode layers.

10. The semiconductor memory device according to claim 9, wherein at least a portion of the source line discharge circuit overlaps with the step structure in a vertical direction.

11. The semiconductor memory device according to claim 8, further comprising:
    a plurality of bit lines disposed on the memory cell array, and electrically coupled with the vertical channels; and
    a plurality of dummy bit lines disposed on the memory cell array,
    wherein at least a portion of the source line discharge circuit overlaps with the dummy bit lines in the vertical direction, and
    wherein the plurality of dummy bit lines are not electrically coupled to the vertical channels.

12. The semiconductor memory device according to claim 11, wherein the discharge plate is formed of a first material and the plurality of bit lines is formed of a second material, and wherein the first material has a higher melting point than the second material.

13. The semiconductor memory device according to claim 11, further comprising:
    a plurality of dummy vertical channels passing through the electrode layers and the interlayer dielectric layers below the plurality of dummy bit lines, wherein the plurality of dummy vertical channels are coupled to the source plate.

14. The semiconductor memory device according to claim 8, wherein the discharge plate is formed of a first material and the source plate is formed of a third material, and wherein the first material has a smaller resistivity than the third material.

15. The semiconductor memory device according to claim 8,
    wherein the discharge path comprises:
    a plurality of bottom wiring lines disposed in the plurality of dielectric layers; and
    a plurality of bottom contact plugs coupling the bottom wiring lines disposed in the plurality of dielectric layers and coupling uppermost bottom wiring lines and the discharge plate, and
    wherein the bottom contact plugs are aligned in the vertical direction on the source line discharge circuit.

16. The semiconductor memory device according to claim 15, wherein the discharge plate and the bottom wiring lines are formed of the same material.

17. A semiconductor memory device comprising:
    a plurality of memory structures each including a source plate and a memory cell array which is disposed on the source plate;
    a discharge plate disposed on bottom surface of the source plates of the memory structures;
    a logic circuit disposed on a substrate below the discharge plate; and a plurality of discharge paths coupling the logic circuit and the discharge plate, wherein the logic circuit includes a peripheral circuit and a source line discharge circuit, the source line discharge circuit electrically couples the discharge plate to a ground node in response to a source line discharge control signal from the peripheral circuit during a memory operation.

18. The semiconductor memory device according to claim 17, wherein the discharge plate is divided into a plurality of segments in correspondence to the source plates.

19. The semiconductor memory device according to claim 18, wherein the logic circuit includes a plurality of source line discharge circuits which are coupled to the plurality of segments through the discharge paths, respectively, and electrically couple the respective segments to a ground terminal in response to a source line discharge control signal, and wherein the source line discharge circuits are controlled independently of one another by the peripheral circuit.

20. The semiconductor memory device according to claim 17, wherein the discharge plate is formed of a first material and the source plate is formed of a second material, and wherein the first material has a smaller resistivity than the second material.

* * * * *